United States Patent
Page

[15] 3,652,905

[45] Mar. 28, 1972

[54] SCHOTTKY BARRIER POWER RECTIFIER

[72] Inventor: Derrick J. Page, Pittsburgh, Pa.

[73] Assignee: Westinghouse Electric Corporation, Pittsburgh, Pa.

[22] Filed: May 26, 1970

[21] Appl. No.: 40,625

[52] U.S. Cl.......................317/234 R, 317/235 T, 317/235 U

[51] Int. Cl...........................................................H01l 9/00

[58] Field of Search..........................................317/234, 235

[56] References Cited

UNITED STATES PATENTS 3,185,935 5/1965 White....................................317/235

3,265,542 8/1966 Hirshon................................317/235

OTHER PUBLICATIONS

IBM Tech Discl. Bul., " Schottky Diode" by Esaki et al., Vol. 11, No. 1, June 1968, p. 19.

*Primary Examiner*—Jerry D. Craig

*Attorney*—F. Shapoe and C. L. Menzemer

[57] ABSTRACT

This disclosure relates to a Schottky barrier semiconductor device in which the anode contact is surrounded by a tapered layer of a high resistivity, high work function material.

5 Claims, 6 Drawing Figures

PATENTED MAR 28 1972 3,652,905

WITNESSES

Bernard R. Gregory

James F. Young

INVENTOR
Derrick J. Page
BY
C. L. Menzemer
ATTORNEY

SCHOTTKY BARRIER POWER RECTIFIER

BACKGROUND OF THE INVENTION

1. Field of Invention

This invention is in the field of semiconductor devices and is particularly concerned with Schottky barrier power rectifier devices.

2. Description of Prior Art

The Schottky barrier diode has certain advantages over p-n junction devices. First, the forward voltage drop of a Schottky barrier diode is less than that of a comparable p-n junction diode and secondly, since the Schottky barrier diode is a majority carrier device there is no minority carrier storage effect during switching.

The structure of a Schottky barrier rectifier in its simplest form is shown schematically in FIG. 1.

When the diode 10 is reversed biased and Schottky barrier metal contact 12 made negative with respect to cathode contact 14, a depletion region 16 extends from contact 12 toward interface between *n* region 18 and *n*+ region 20. The electrical field is at a maximum at interface 22 between contact 12 and region 18 and decreases linearly reaching zero at depletion depth 24.

The electrical field at edge 25 of the metal contact 12 is even higher due to the fringing of the electric field and as the reverse bias is increased excessive leakage current occurs at edge 25 of the contact 12. This condition causes the reverse blocking voltage of the device to be determined by the edge effect rather than by the Schottky barrier.

Two methods are now commonly employed to overcome edge effect in the device.

With reference to FIG. 2, in one of the two methods now commonly employed, an oxide layer 30 having a window 32 therein is formed on surface 34 of region 18 prior to the formation of the anode contact. Anode contact 12 makes contact with region 18 through the window 32 and overlaps the window onto the surrounding oxide.

When the diode is reverse biased, the electrical field in the region 18 at edge 34 of the anode metal contact 12 is weaker than directly under the contact 12 because the electrical field has to penetrate the oxide.

With reference to FIG. 3, in the second method now commonly employed, a guard ring region 36 of opposite semiconductivity type than region 18 is formed by diffusion in region 18. The contact 12 terminates with its edge over the guard ring 36. In effect, this device is two Schottky barrier devices. One consisting of anode 12 and region 18 and the second consisting of anode 12 and region 36. The doping concentration of region 36 is so coordinated with the doping concentration of region 18, that when the device is reverse biased the Schottky barrier device formed between contact 12 and region 18 breaks down before the Schottky barrier device formed by contact 12 and region 36.

Of the two methods, the second is considered the more effective, however, the structure requires additional processing and yields are low.

SUMMARY OF THE INVENTION

In accordance with the present invention there is provided;

A Schottky barrier type semiconductor device comprising 1. a body of semiconductor material, said body having opposed major surfaces, said body having first and second regions of the same type of semiconductivity, said first region being doped to a higher concentration than said second region, said regions each extending from one of said major surfaces to an interface within said body, 2. an ohmic cathode contact affixed to said first region on one of said major surfaces, 3. a Schottky barrier anode contact affixed to said second region on the other of said major surfaces, and 4. a tapered layer of a high electrical resistance material extending laterally from said anode contact to the surface of said second region, said tapered layer being thicker at the periphery of said anode contact than at the surface of said second region.

BRIEF DESCRIPTION OF THE DRAWING

The invention will become more readily apparent from the following exemplary description in connection with the accompanying drawings, wherein.

DESCRIPTION OF PREFERRED EMBODIMENT

Figure 1:
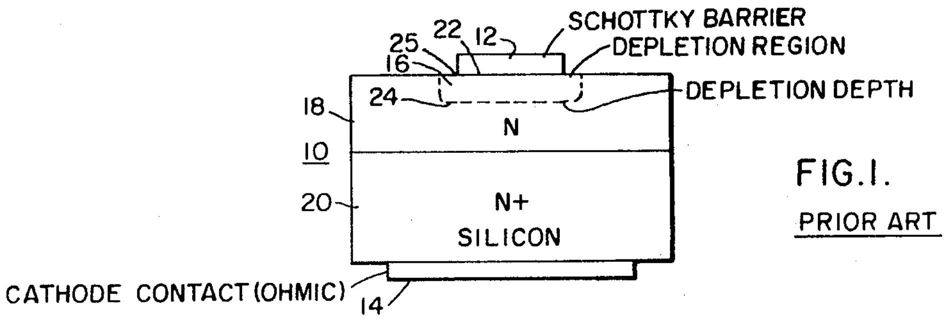
FIG. 1. PRIOR ART
FIGS. 1 to 3 are side views, partially in section of prior art Schottky barrier devices.
Figure 2:
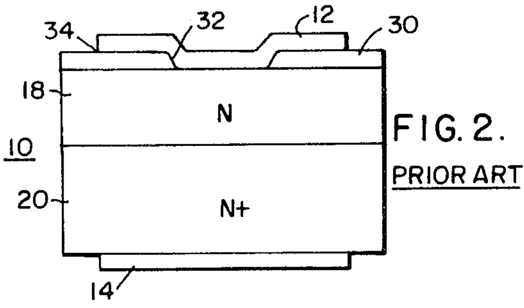
FIG. 2. PRIOR ART
Figure 3:
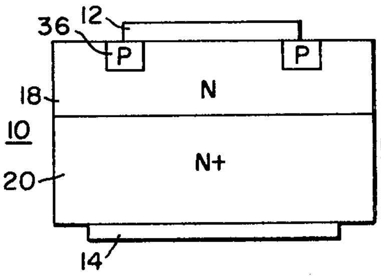
FIG. 3. PRIOR ART
Figure 4:
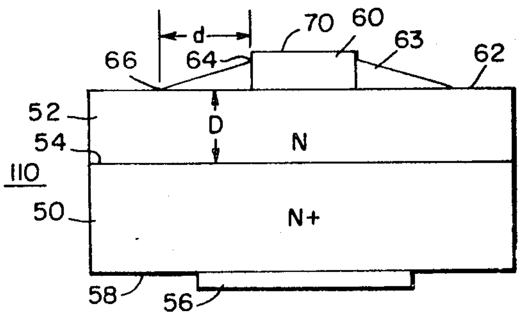
FIG. 4 is a side view, partially in section of a Schottky barrier device setting forth the teachings of this invention.

With reference to FIG. 4, there is illustrated a Schottky barrier power rectifier 110 referred to hereinafter as the device 110 setting forth the teachings of this invention. For purposes of a simplified explanation, the device 110 will be described in terms of a silicon device.

The device 110 comprises; a highly doped N+ region of silicon 50, a lesser doped N region of silicon 52 epitaxially grown on surface 54 of region 50, an ohmic contact 56 on surface 58 of region 50, a Schottky barrier anode contact 60 on surface 62 of region 52, and a tapered layer 63 of high resistance material disposed on surface 62 about the contact 60 and extending laterally to the surface 62.

The N+ region 50 is doped to a concentration of from $10^{17}$ to $10^{21}$ atoms of dopant per cc. of semiconductor material. Suitable dopants are arsenic, antimony and phosphors. The region 50 must be doped to the level indicated to prevent parasite series resistance during forward conduction of the device.

The thickness of region 50 is not critical. It must be thick enough to allow handling of the device during fabrication but not so thick as to cause significant electrical resistance. Typically, region 50 would have a thickness of from 6 to 10 mils.

The N region 52 is doped to a concentration of from $10^{15}$ to $10^{16}$ atoms of dopant per cc. of silicon for power devices. If the region 52 is doped to a concentration below $10^{15}$ the device will exhibit a high forward voltage drop. If the region is doped to a level much above $10^{16}$, there will be a high electrical field built up at the interface between regions 52 and contact 60 during reverse biasing which will result in avalanche breakdown and a poor reverse blocking characteristic.

The thickness of region 52 is a function of the reverse voltage the device is designed to handle. The reverse voltage parameter also controls the doping level. Typically, a region doped to a level of $6 \times 10^{15}$ in a device handling 0.5 volt with a current density of 50 amps per square centimeter will have a thickness of about 3 microns.

The contact 56 is an ohmic contact to region 50. If region 50 is doped to a level between $10^{17}$ and $10^{19}$ contact 56 is preferably of an alloy including an N-type dopant such as for example, a gold-antimony alloy which may be partially diffused into region 50 after being affixed if desired.

If region 50 is doped to a level of from $10^{20}$ to $10^{21}$ the contact may be of any metal.

In either case the contact may be affixed to surface 58 by any process known to those skilled in the art and preferably by plating or evaporating. A thickness of about 1,000 A. is typical in such devices.

The Schottky barrier anode contact 60 may consist of any metal having a high work function as for example, aluminum, chromium, platinum, tungsten, molybdenum, tantalum, gold, silver and base alloys thereof. In addition, the contact 60 may be comprised of a composite such as a first layer in contact with region 52 of a high work function metal such as aluminum and a second layer of an easily solderable metal such as nickel.

The thickness of the Schottky barrier anode contact should be at least 2,000 A.

The layer 63 of high resistivity material may consist of a metal alloy, a semiconductor material or a compound consisting of a combination of a ceramic material and a metal.

Examples of suitable metal alloys that may comprise layer 63 include nickel-chromium alloys of the type sold under the trade mark "Nichrome," an alloy comprising, by weight, 60 percent nickel, 24 percent iron and 16 percent chromium. Another suitable alloy comprises, by weight, 73.5 percent nickel, 20 percent chromium, 5 percent aluminum, and 1.5 percent silicon.

Examples of suitable semiconductor materials that may comprise layer 63 include tellurium, cadmium sulfide, cadmium selenide, indium antimonide, indium arsenide, gallium arsenide, silicon, lead sulfide, lead selenide, and lead telluride.

Examples of suitable ceramic-metal compounds that may comprise layer 63 include refractory compositions made by bonding grains of ceramics, metal carbides, and nitrides with metal. Such compounds are known as cermets and typically contain nickel with lead silicate; chromium with aluminum silicate; tungsten with beryllium and aluminum oxides; and molybdenum with calcium and aluminum oxides.

The thickness of tapered layer 63 over its length from point 64 at the periphery of contact 60 to point 66 where it ends on surface 62 depends on the material employed.

At the thickest point, at the periphery of contact 60, the layer 63 should have a resistance of $10^7$ to $10^{10}$ ohm per square and at the thinnest point, 66, as it approaches the surface 62, it should have a resistance of from $10^{12}$ to $10^{13}$ ohm per square.

If the tapered layer 63 is of tellurium it should have a thickness of about 200 A. at point 64.

The layer 63 tapers from its thickest point, point 64, at the periphery of contact 60 to essentially a zero thickness at point 66. The distance between points 64 and 66, "$d$," in FIG. 4 is at least equal to the thickness "D," in FIG. 4, the thickness of region 52.

The layer 63 may be applied by film techniques known to those skilled in the art. If the contact 60 has been applied by vacuum evaporation through a mask held in close proximity to surface 62, the mask need only be moved a short distance, for example 0.25 inch, from its initial position and the resistance material deposited using the same mask.

It will be appreciated that this process may result in a layer of the resistance material being deposited on top surface 70 of contact 60. If such a layer exceeds about 100 A. to 150 A. in thickness it is necessary to either remove the layer entirely or to open an aperture in it to facilitate making electrical contact with contact 60.

Figure 5:
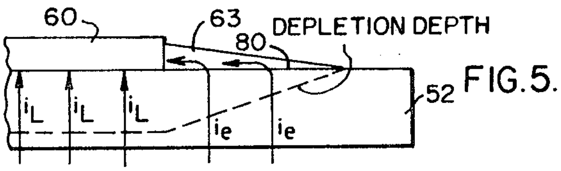
FIG. 5 is a schematic diagram showing the manner in which the Schottky barrier device of this invention operates.

The principle of operation of the device of this invention will be explained with reference to FIGS. 5 and 6.

During operation of the device there is a finite leakage current, designated $i_e$, at the edge 80 of the high resistance layer 63, but if this current then has to travel in the plane of the layer 63 to the anode contact 60 there will be a voltage drop in the resistance layer which results in a lowering of the field at the edge of the Schottky barrier between contact 60 and region 52. The larger the leakage current the larger the voltage drop across the resistance layer and the smaller the field at the edge of the Schottky barrier. The net result is a tapering of the depletion region at the edge of the anode contact and a large reduction in the edge leakage current as shown in FIG. 5.

Figure 6:
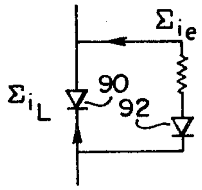
FIG. 6 is a schematic circuit diagram of the device of this invention.

FIG. 6 shows a schematic equivalent circuit diagram of the device of this invention.

Diode 90 is the Schottky barrier diode consisting of contact 60 and region 52 and diode 92 is the Schottky barrier diode consisting of layer 63 and region 52.

While the invention has been described in terms of silicon, it will be understood that the teachings of this invention are equally applicable to Schottky barrier devices made from any other semiconductor material. It should also be understood that the semiconductor material comprising the device may be either N-type or P-type material.

I claim as my invention:

1. A Schottky barrier type semiconductor device comprising 1. a body of semiconductor material, said body having opposed major surfaces, said body having first and second regions of the same type of semiconductivity, said first region being doped to a higher concentration than said second region, said regions each extending from one of said major surfaces to an interface within said body,
2. an ohmic cathode contact affixed to said first region on one of said major surface,
3. a Schottky barrier anode contact affixed to said second region on the other of said major surfaces, and
4. a tapered layer of a high electrical resistance material extending laterally from said anode contact to the surface of said second region, said tapered layer being thicker at the periphery of said anode contact than at the surface of said second region, said tapered layer having a resistance of from $10^7$ to $10^{10}$ ohms per square at its thickest portion and a resistance of $10^{12}$ to $10^{13}$ ohms per square at its thinnest portion.

2. The device of claim 1 in which the tapered layer extends laterally from the anode contact a distance at least as long as the second region is thick.

3. The device of claim 1 in which the tapered layer of high electrical resistance material is selected from the group consisting of metal alloys, semiconductor materials and cermets.

4. The device of claim 1 in which the tapered layer of high electrical resistance material is tellurium.

5. The device of claim 1 in which:

1. the body of semiconductor material consists of silicon,
2. the first region is N-type and doped to a concentration of from $10^{17}$ to $10^{21}$ atoms of dopant per cc. of silicon,
3. the second region is N-type and doped to a concentration of from $10^{15}$ to $10^{16}$ atoms of dopant per cc., of silicon, and
4. the high electrical resistance layer consists of a semiconductor material selected from the group consisting of tellurium, cadmium sulfide, cadmium selenide, indium antimonide, indium arsenide, gallium arsenide, silicon, lead sulfide, lead selenide, and lead telluride.

* * * * *